United States Patent [19]

Kim

[11] Patent Number: 4,968,990
[45] Date of Patent: Nov. 6, 1990

[54] ANALOG-TO-DIGITAL CONVERTER WITH ALL PARALLEL BICMOS

[75] Inventor: Heung-Suck Kim, Incheon, Rep. of Korea

[73] Assignee: Samsung Electronics Co., Ltd., Suwon, Rep. of Korea

[21] Appl. No.: 311,649

[22] Filed: Feb. 15, 1989

[30] Foreign Application Priority Data

May 19, 1988 [KR] Rep. of Korea ............... 88-5889

[51] Int. Cl.$^5$ ............................................. H03M 1/36
[52] U.S. Cl. ............................... 341/159; 341/158
[58] Field of Search ............... 341/132, 135, 136, 159, 341/160, 133, 158

[56] References Cited

U.S. PATENT DOCUMENTS

| | | | |
|---|---|---|---|
| 4,323,887 | 4/1982 | Buurma | 341/136 |
| 4,400,693 | 8/1983 | Flamm | 341/136 |
| 4,449,118 | 5/1984 | Dingwall et al. | 341/136 |
| 4,539,551 | 9/1985 | Fujita et al. | 341/118 |
| 4,547,763 | 10/1985 | Flamm | 341/136 |
| 4,591,830 | 5/1986 | Hanna | 341/159 |
| 4,599,599 | 7/1986 | Sekino et al. | 341/133 |
| 4,644,322 | 2/1987 | Fujita | 341/159 |
| 4,745,393 | 5/1988 | Tsukada et al. | 341/136 |
| 4,777,470 | 10/1988 | Naylor et al. | 341/163 |

Primary Examiner—William M. Shoop, Jr.
Assistant Examiner—Brian K. Young
Attorney, Agent, or Firm—Ladas & Parry

[57] ABSTRACT

An analog-to-digital converter with all parallel BiCMOSs are provided. Comparators each composed of a plurality of bipolar transistors are included for comparing an analog signal with a reference voltage. A transfer circuit comprising a plurality of CMOS transistors are provided for transferring an output from the comparators to a corresponding input mode. A plurality of first ROMs and a second ROM, each of which is composed of a plurality of CMOS transistors, provide outputs of digital signals coded by the transfer means.

10 Claims, 8 Drawing Sheets

ANALOG-TO-DIGITAL CONVERTER WITH ALL PARALLEL BICMOS

BACKGROUND OF THE INVENTION

This invention relates to an analog-to-digital converter with all-parallel BiCMOSs(bipolar and CMOS transistors) that convert an image signal of a high speed analog signal to a digital signal.

An all parallel analog-to-digital converter has been mainly manufactured employing bipolar transistors. Recent tendency is to use CMOS transistors. An analog-to-digital converter only employing bipolar or CMOS transistors is seriously dependent on the characteristics of the individual elements. The bipolar transistors have good matching properties and high speed, but require larger current consumption and relatively larger dimensions compared to MOS transistors. For MOS transistors, their dimensions become smaller and smaller and processing speeds of them become faster. In addition, by the development of the process and circuit technology, the offset voltage difference has been reduced. The MOS transistors are, however, not adequate for the circuits that need the device matching high response and high speed.

SUMMARY OF THE INVENTION

An object of the invention is to solve the problems of the prior art, and provide an all-parallel BiCOMSs analog-to-digital converter which uses bipolar and CMOS transistors for the purpose of good matching and low power and high integration.

The above object may be effected by providing an analog-to-digital converter with all parallel BiCMOSs comprising:

comparing means comprising a plurality of bipolar transistors for comparing an analog signal with a reference voltage;

transfer means comprising a plurality of CMOS transistors for transferring an output from said comparing means to a corresponding input node; and memory means comprising a plurality of CMOS transistors for providing an output digital signal coded by said transfer means.

The converter according to the present invention provides several advantages which are an analog signal processing by the bipolar transistors, low power consumption, and higher integration by the CMOS transistors.

DETAILED DESCRIPTION OF PREFERRED EMBODIMENT

Figure 1:
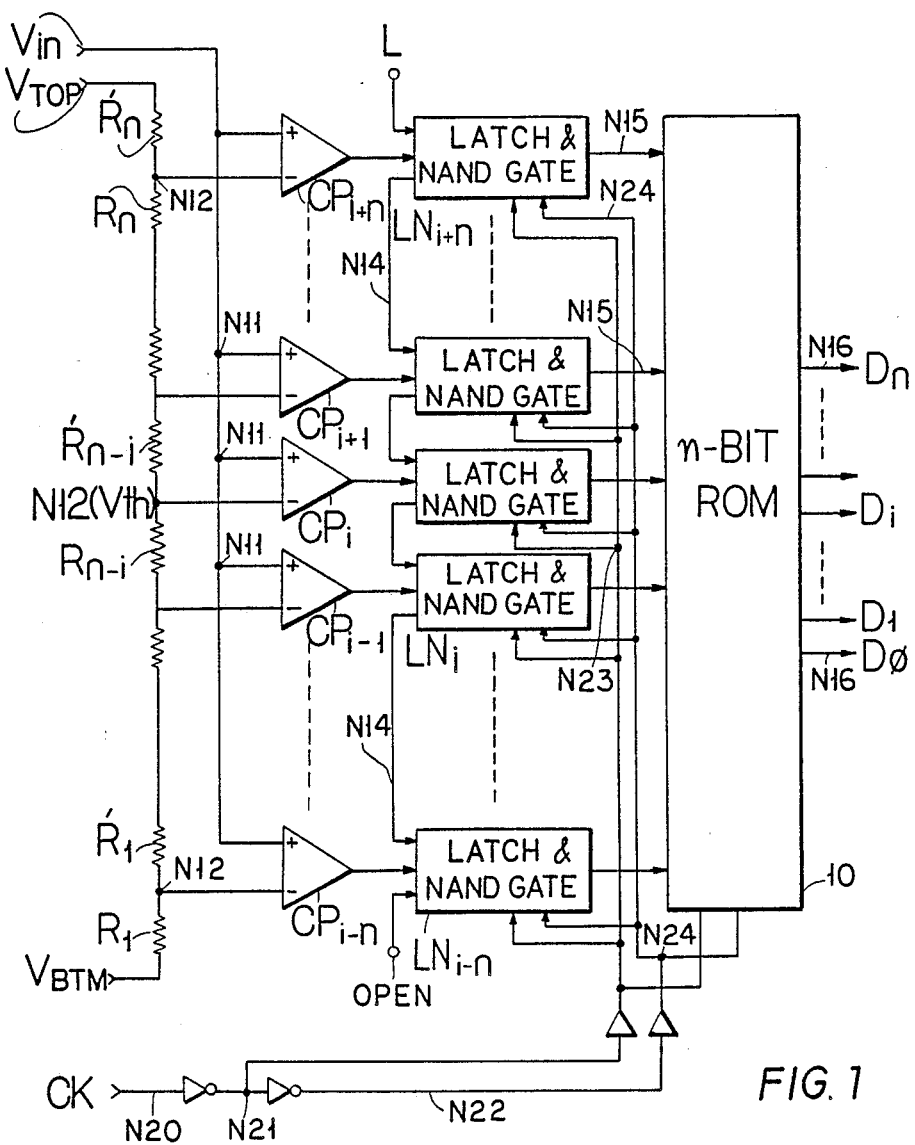
FIG. 1 is a block circuit diagram of an analog-to-digital converter with all parallel BiCMOS according to the present invention.

FIG. 1 shows a block circuit diagram of an analog-to-digital converter with all parallel BiCMOSs in which terminal for providing a supply voltage $V_{TOP}$ is connected with each corresponding inverting node of comparators $CPi-n-Cpi+n$ divided through each corresponding node to which by each corresponding, respectively, distribution resistor pairs $R_1$, $R'_1-R_n$, $R'_n$. A terminal for providing an analog input signal Vin is connected with each corresponding non-inverting node of the comparators. The comparators $CPi-n-CPi+n$ are constructed with the bipolar transistors of good offset characteristics. So the comparating voltages of the nodes $N_{11}$, $N_{12}$ are applied to a latch and NAND gates $LNi-n-LNi+n$ which is constructed with the CMOS gates and output to the each corresponding node $N_{15}$ for the analog input signal Vin level.

For the latch and NAND gates are connected with a CMOS ROM and CMOS latch 10, digital signals of lower and upper bits are outputted through nodes designated as symbol $N_{16}$.

Figure 2:
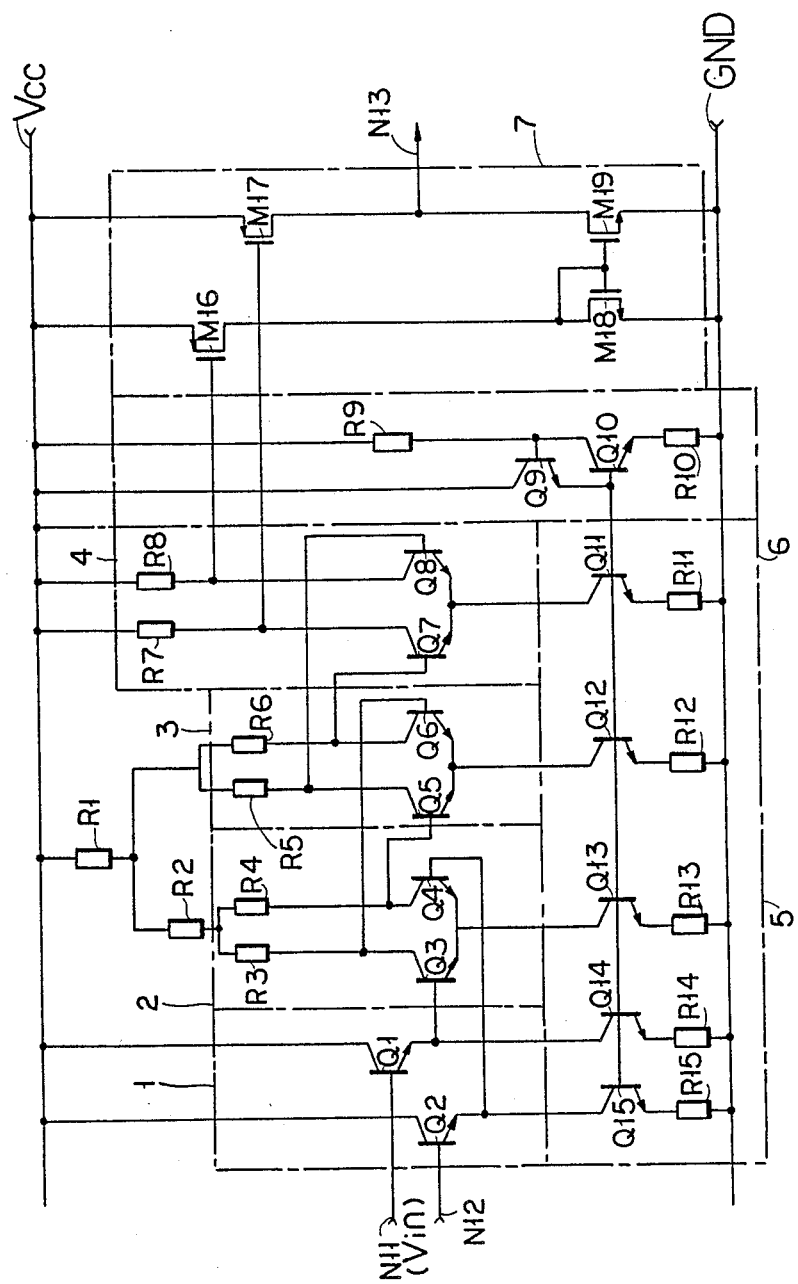
FIG. 2 is a circuit of a comparator of the present invention.

In FIG. 2, the comparators $Pi-n-Pi+n$ of bipolar transistors are connected to a buffer 1 of transistors $Q_1$, $Q_2$. The emitters of the transistors $Q_1$, $Q_2$ are connected to a differential amplifier 2 input consisting of transistors $Q_3$, $Q_4$ and resistors $R_3$, $R_4$. And their outputs are connected to a differential amplifier 3 input of transistors $Q_5$, $Q_6$ and resistors $R_5$, $R_6$. Their outputs are connected to a differential amplifier 4 input of transistors $Q_7$, $Q_8$ and resistors $R_7$, $R_8$ and the differential amplifier 4 is connected to a level converter 7 of the MOS transistors $M_{16}-M_{19}$.

A constant current source 6 consisting of resistors $R_9$, $R_{10}$ and transistors $Q_9$, $Q_{10}$ is connected to a current supply section 5 consisting of resistors $R_{11}-R_{15}$ and transistors $Q_{11}-Q_{15}$. The constant current source 6 drives the differential amplifiers 2, 3, 4.

Figure 3:
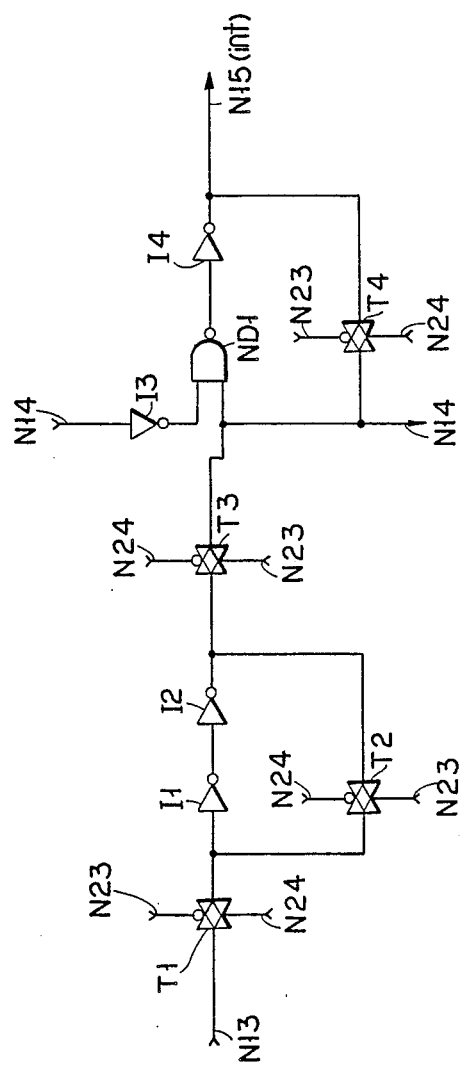
FIG. 3 is a circuit diagram of a latch and NAND gate of the present invention.

FIG. 3 is a circuit diagram of a latch and NAND gate of the invention. A switch $T_1$ connected to a node $N_{13}$ is connected to a feedback signal of an inverter $I_2$ through an inverter $I_1$. An output of a switch $T_2$ and the converter $I_2$ is connected to a switch $T_3$ connected to a NAND gate $ND_1$ of which another input is an output of the inverter $I_3$. An output of an inverter $I_4$ is connected to a node $N_{15}$ and fed-back to a node $N_{14}$ through the switch $T_4$. The NAND gate $ND_1$ outputs a high level signal to the node $N_{15}$ with respect to the analog input signal Vin.

Figure 4:
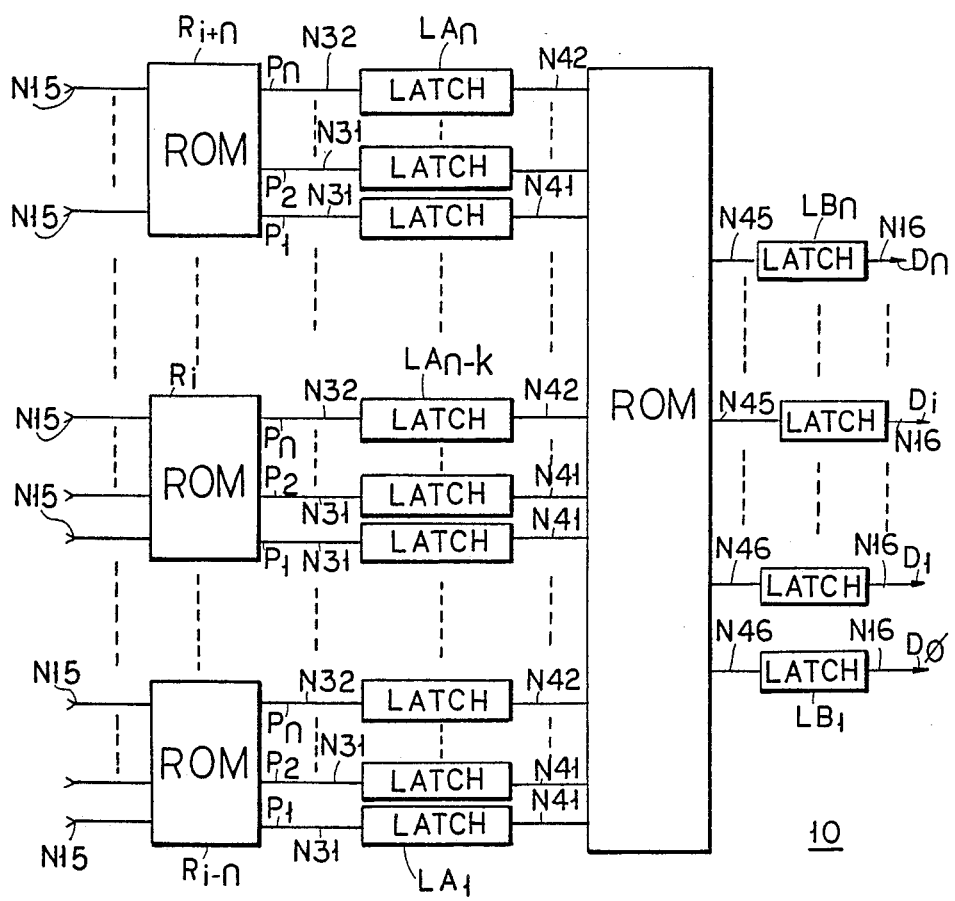
FIG. 4 is a block diagram of a n-bit ROM and latch, of the present invention.
Figure 5:
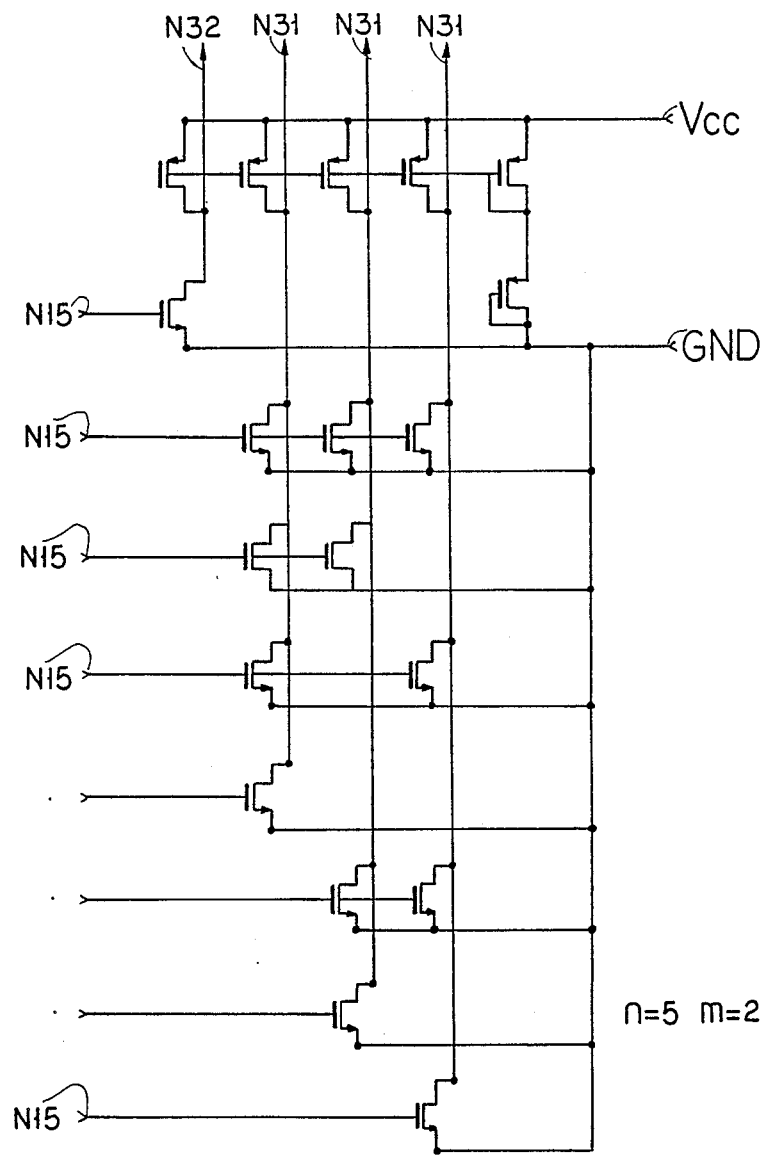
FIG. 5 and FIG. 6 are circuits of the n-bit ROM of the present invention.

FIG. 4 shows a block diagram of a n-bit ROM and latch. The first ROMs $Ri-n-Ri+n$ connected to the node $N_{15}$ and the latches $LA_1-LA_n$ are connected to the each corresponding ROM so that lower n-m bits signal and nodes $N_{31}$ output boundary signals. The second ROMs and latches $LB_1-LB_n$ have upper m bits signal output. The first ROMs $Ri-n-Ri+n$ are constructed with the MOS transistors between a plurality of nodes $N_{15}$ and the nodes $N_{31}$, $N_{32}$ and the ouputs of nodes $N_{31}$, $N_{32}$ are defined by the node $N_{15}$ (FIG. 5). The second ROM is constructed with the MOS transistors between a plurality of nodes $N_{41}$, $N_{42}$ and an output node $N_{45}$ so that an upper level MSB and a lower level LSB are determined.

Figure 7:
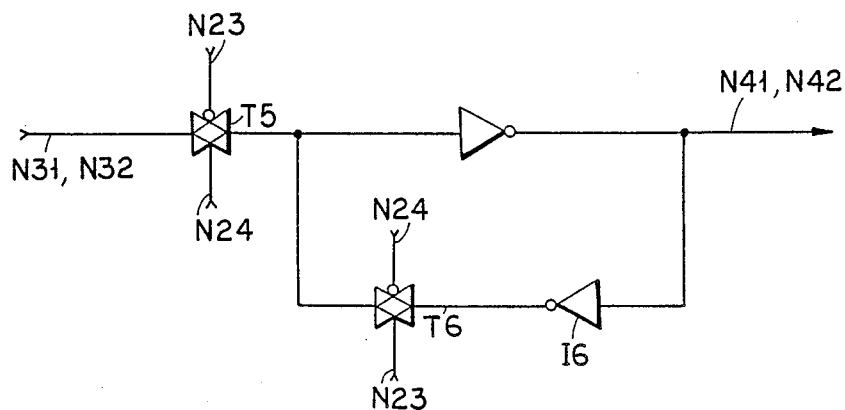
FIG. 7 and FIG. 8 are circuits of the latch of the present invention.
Figure 8:
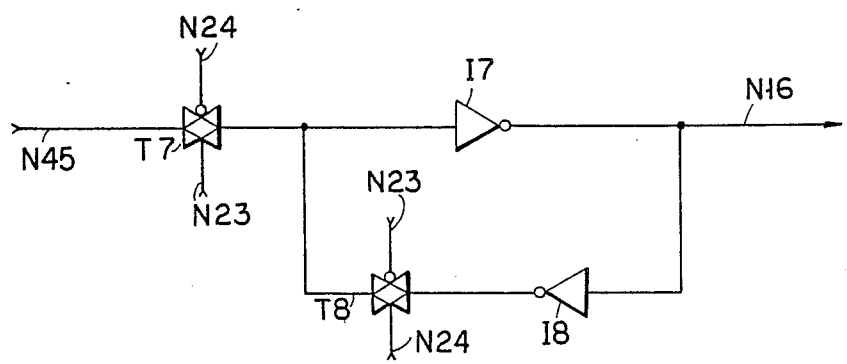
Figure 9:
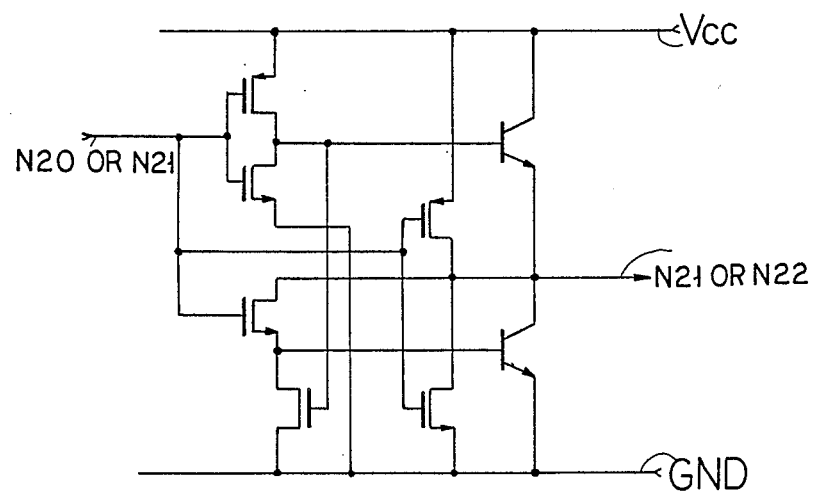
FIG. 9 is a circuit of a clock buffer of the present invention.
Figure 10:
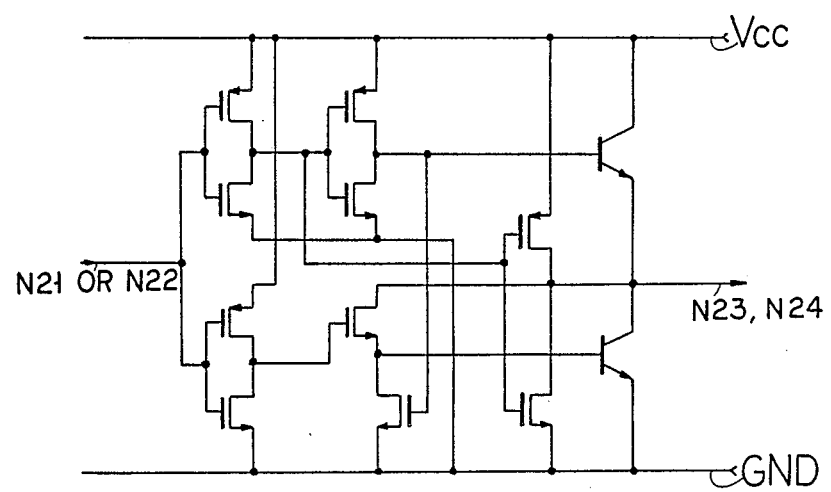
FIG. 10 is a circuit of a clock driver of the present invention.

A clock buffer shown in FIG. 4 is constructed with the MOS and bipolar transistors between the nodes $N_{20}$, $N_{21}$, $N_{22}$ as shown in FIG. 9. A clock driver is constructed with the MOS and bipolar transistors between the nodes $N_{21}$, $N_{22}$, $N_{23}$, $N_{24}$ as shown in FIG. 10. The latches $LA_1$-$LA_n$ are constructed (FIG. 7) with a switch $T_5$ and an inverter $I_5$ between the nodes $N_{31}$, $N_{32}$, $N_{41}$, $N_{42}$ and fed-back to an inverter $I_6$ and a switch $T_6$. As shown in FIG. 8, the latches $LB_1$-$LB_n$ are constructed with a switch $T_7$ and an inverter $I_7$ between the node $N_{45}$, $N_{16}$ and fed-back to an inverter $I_8$ and a switch $T_8$.

The operation of the circuit will now be described.

In FIG. 1, the comparators CPi−n-CPi+n are applied with the analog input signal Vin and the supply voltages $V_{TOP}$, $V_{BTM}$ and compare them by the resistor $R_1$-$R_n$ divided reference voltages.

For example, the ith comparator CPi receives the analog input signal Vin and a reference voltage Vth. A compared signal is applied to the differential amplifier 2, 3, 4 through the buffer 1 shown in FIG. 2. The differential amplifiers 2, 3, 4 consisting of the transistors $Q_3$-$Q_8$ give the small difference of the differential amplifier input to the gates of MOS transistors $M_{16}$, $M_{17}$ of the level converter 7. So the output node $N_{13}$ has a low or high CMOS logic level. The number of the differential amplifiers 2, 3, 4 consisting of the transistors $Q_3$-$Q_8$ may be increased or decreased and the input buffer may be removed. The constant current part 6 supplies the constant current through the transistors $Q_9$ and $Q_{10}$ and turns on the transistors $Q_{11}$-$Q_{15}$ of the current supply section to allow the buffer 1 and the differential amplifiers 2, 3, 4 to operate. An output of the node $N_{13}$ is applied to the latch and NAND gate LNi shown in FIG. 3. A clock CK is applied to the node $N_{20}$ in a high level. As the node $N_{24}$ is a high level and the node $N_{23}$ is a low level, the ransistors $T_1$, $T_4$ are turned on, $T_2$, $T_4$ are turned off and transferred to the inverters $I_1$, $I_2$. An output at the output node $N_{15}$ is in a precedent state through the positive feedback loop of the NAND gate $ND_1$, inverter $I_4$, and switch $T_4$.

For the applied clock CK in the node $N_{20}$ having a low level, the node $N_{24}$ has a low level and the node $N_{23}$ has a high level so that the transistor $T_1$, $T_4$ are turned off and $T_2$, $T_3$ are turned on. The signal propagation from the comparator CPi to the latch and NAND gate LNi is blocked by the transistor $T_1$ and the output node $N_{15}$ has the signal latched through the feedback loop.

The NAND gate $ND_1$ has the role of having only one output in a high level and others in low levels from the latch and the NAND gate(LNi−n-LNi+n). When the analog input signal Vin is larger than the reference voltage of the i-th node $N_{12}$ and smaller than the one of the i+1th node, the outputs lower than i have a high level, the outputs higher than i+1 have a low level. When a clock signal applied to node $N_{20}$ has a low level and the above output signals are provided to the NAND gate $ND_1$ through the transistor $T_3$ in a latched state by the inverters $I_1$ and $I_2$ and transistor $T_2$ shown in FIG. 3, the ith node $N_{14}$ becomes a high level and i+1th node becomes a low level so that ith output node has a high level.

But, the outputs exceeding i+1 latch and NAND gate become a low level, because the input of node $N_{14}$ has a low level when inputted to the NAND gate. The outputs lower than ith latch and NAND gates become a low level, because the input of the inverter $I_3$ coming from the NAND gate node $N_{14}$ and the above latches have a high level. By this operation, that is, if the analog input signal is larger that the supply voltage $V_{BTM}$ and the clock signal is a low level, the only one of the latch and NAND gates LNi−n-LNi+n sends out a high level output signal, and the outputs of the remainder become a low level.

Also, if the clock CK signal changes to a high level state at the above state, the switch $T_3$ is turned off and the switch $T_4$ is turned on so that the output comes in a latched state. At this time, the only ith node $N_{15}$ is a high level and the higher and lower nodes that i are a high level state so that the inputs of the higher and lower that ith NAND gates become a low level state through the switch $T_4$. Therefore the outputs of all nodes except the ith node are high level states. Under the ith node, the high level output signal is applied to the NAND gate $ND_1$ through the switch $T_4$, and the low level signal is applied to the input gate of the inverter so that the only ith output node $N_{15}$ becomes the high level state. Conclusively, if the analog input signal Vin is larger than the reference level of arbitrary node $N_{12}$, whereas smaller than the output of the node $N_{15}$, it becomes only the high level and applied to the ROM and latch 10 shown in FIG. 4. A signal with an information about the magnitude of th analog signal is applied to the first ROM Ri−n-Ri+n through the node $N_{15}$, and goes to each NMOS gates being coded within the first ROM for the correspondance of the magnitude of the analog signal is applied to the node $N_{12}$ shown in FIG. 1.

In the first ROM, a coding signal is determined by the lower bit $P_n$ and the output signal of the node $N_{31}$ where the boundary signal is applied, and the input signal applied to the first ROM Ri−n-Ri+n in a high level by the selection of only one of the signal of the latch and NAND gate LRi−n-LRi+n so that only the NMOS transistors with a high level gate input being coded are turned on (FIG. 5).

Therefore, only the output connectd to the turned-on NMOS transistors becomes a high level, and outputs of the remainder become high levels, so that the lower bit n-m coding are determined and the remainder upper bit m are determined by the outputs of the nodes $N_{31}$, $N_{32}$ in the second ROM.

FIG. 5 is one embodiment of the first ROM for n=5 and m=2, where the PMOS transistors are used as the load of the coded NMOS transistors and this embodiment may be replaced by a precharge circuit.

The output of the node $N_{31}$ determined at the first ROM that is the lower n-m bit signal and the boundary signal of the node $N_{32}$ is propagated reversely to the nodes $N_{41}$, $N_{42}$ through the switch $T_5$ and the inverter $I_5$ since the node $N_{23}$ has a high level, and the node $N_{24}$ has a high level (FIG. 7) when the clock CK signal of the latch $LA_1$-$LA_n$ has a high level. But, when the clock signal CK of the latch is a high level, the output of the node $N_{31}$ and the boundary signal of the node $N_{32}$ are remained in a latched state and propagated to the second ROM.

The second ROM plays the role of determining the value of the undetermined upper m bits and propagating the output of the determined lower n-m bits.

Figure 6:
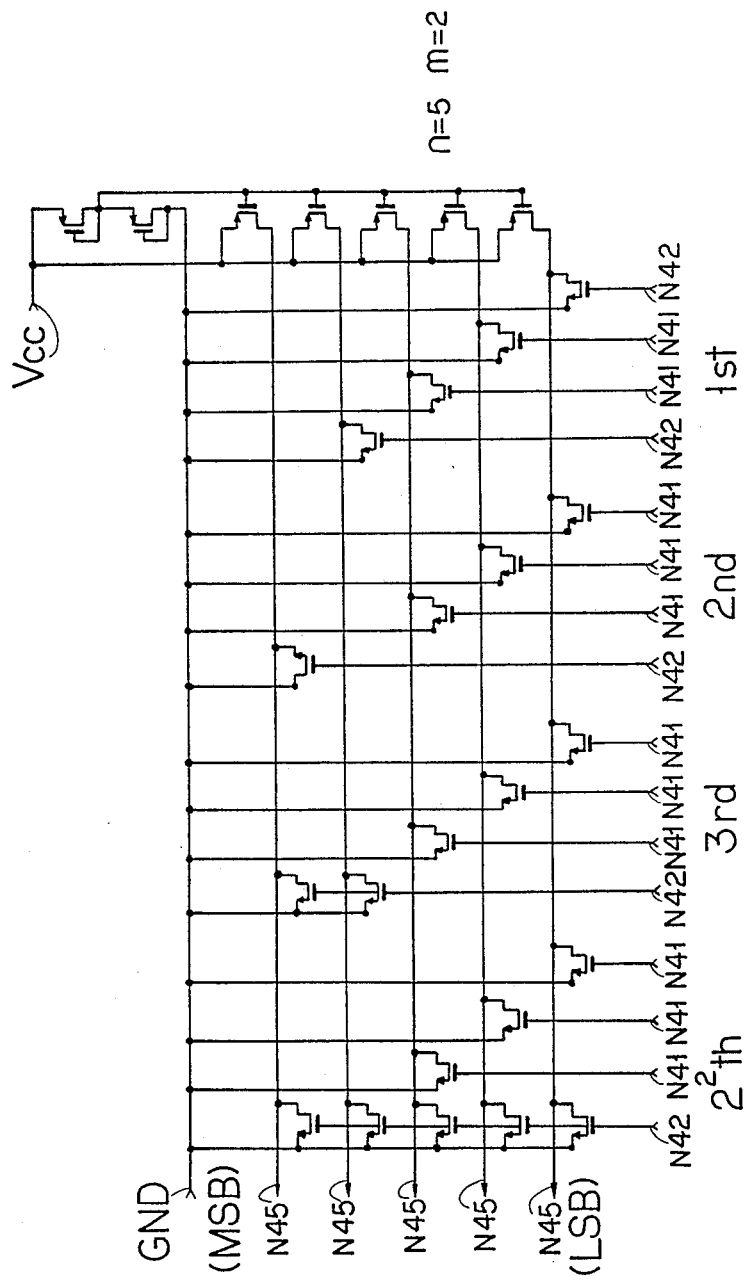

FIG. 6 is an embodiment of a circuit for n=5 and m=2. Therefore, when the output signal of the first ROM Ri−n-Ri+m is propagated to the second ROM through the latch $LA_1$-$LA_n$, only the NMOS transistors with high level gate inputs of nodes $N_{41}$ and $N_{42}$ are turned on so that the high level signal of nodes $N_{41}$, $N_{42}$ and only the drain node $N_{45}$ of the NMOS transistor with a high level gate input become a low level, the rest nodes become high levels.

Therefore, the n bit digital coding signals are outputted. The digital outputs coming from the latch $LB_1$-$LB_n$ are inverted through the inverter $I_7$ and transferred to the node $N_{14}$.

The clock signal provided to the latch and NAND gate $LN_{i-n}$-$LN_{i+n}$ and the bit ROM and latch 10 through the node $N_{23}$, $N_{24}$ is provided as an external clock to the node $N_{20}$, and the complex signal of the node $N_{20}$ through buffers for the inverters IA, IB is provided to the node $N_{21}$, and this signal is provided to the node $N_{23}$ through the clock driver BA, BB, and the signal of node $N_{21}$ becomes again a same-phase signal with the signal of nodes $N_{22}$, $N_{20}$ through the buffers for inverter IA, IB, and provided to the node $N_{24}$.

As mentioned above, this invention can transfer a high speed analog signal using the bipolar transistors with the good offset and signal processing capability in the comparing section.

By using the CMOS transistors in the logic section which consist of the latch and ROM, the amplified signal at the front of the comparator is converted as a CMOS level and processed so that the power comsumption can be reduced and the integration of IC is easy.

This invention is no way limited to the example described hereinabove. Various modifications of the disclosed embodiment as well as other embodiments of the invention, will become apparent to persons skilled in the art upon reference to the description of the invention. It is therefore contemplated that the appended claims will cover any such modification of embodiments as fall within the true scope of the invention.

What is claimed is:

1. An analog-to-digital converter with all parallel BiCMOS comprising:
   comparing means comprising a plurality of bipolar transistors for comparing an analog signal with a reference voltage;
   transfer means comprising a plurality of CMOS transistors for transferring an output from said comparing means to a corresponding input node; and
   memory means comrising a plurality of CMOS transistors for providing an output digital signal coded by said transfer means.

2. An analog-to-digital converter with all-parallel BiCMOSs as claimed in claim 1 wherein said comparing means are composed of a plurality of comparators, said transfer means are composed of a plurality of latches and NAND gates, and said memory means are composed of a plurality of bit ROMs and latches.

3. An analog-to-digital converter with all parallel BiCMOSs as claimed in claim 2 wherein each said comparator comprises a pair of transistors and a buffer, a plurality of differential amplifiers, and a level converter including a plurality of MOS transistors.

4. An analog-to-digital converter with all parallel BiCMOSs as claimed in claim 2 wherein said latches and NAND gates comprise a first feedback circuit including switches and inverters, and a second feedback circuit including a NAND gate, inverter, and transistor.

5. An analog-to-digital converter with all parallel BiCMOSs as claimed in claim 2 wherein said bit ROMs and latches comprise a plurality of first ROMs for providing a boundary signal and corresponding lower bit signals, a second ROM providing a plurality of upper bit coding signals, and a plurality of latches composed between said plurality of first ROMs and a second ROM.

6. An analog-to-digital converter with all parallel BiCMOSs as claimed in claim 3 wherein said latches and NAND gates comprise a current source composed of a plurality of resistors and transistors for driving said buffer and differential amplifiers, said current source is connected to a constant voltage source section.

7. An analog-to-digital converter with all parallel BiCMOSs as claimed in claim 4 characterized in that said NAND gate and inverter in said second feedback circuit are substituted for logic gates with identical logic characteristics.

8. An analog-to-digital converter with all parallel BiCMOSs as claimed in claim 5, said first ROMs conprise each corresponding CMOS transistor connected between input nodes and output nodes of said first ROMs.

9. An analog-to-digital converter with all parallel BiCMOSs as claimed in claim 5 wherein said second ROM comprises multi-stage MOS transistors connected between a plurality of input nodes and output nodes of said second ROM.

10. An analog-to-digital converter with all parallel BiCMOSs as claimed in claim 5 wherein said plurality of latches composed between said first and second ROMs comprise a plurality of MOS and bipolar transistors connected between each input and output node.

* * * * *